US008835311B2

(12) United States Patent
Collins et al.

(10) Patent No.: US 8,835,311 B2
(45) Date of Patent: *Sep. 16, 2014

(54) HIGH TEMPERATURE TUNGSTEN METALLIZATION PROCESS

(71) Applicant: Applied Material, Inc., Santa Clara, CA (US)

(72) Inventors: Joshua Collins, Sunnyvale, CA (US); Murali K. Narasimhan, San Jose, CA (US); Jingjing Liu, Santa Clara, CA (US); Sang-Hyeob Lee, Fremont, CA (US); Kai Wu, Palo Alto, CA (US); Avgerinos V. Gelatos, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/145,434

(22) Filed: Dec. 31, 2013

(65) Prior Publication Data
US 2014/0187038 A1 Jul. 3, 2014

Related U.S. Application Data

(63) Continuation of application No. 13/660,463, filed on Oct. 25, 2012, now Pat. No. 8,617,985.

(60) Provisional application No. 61/553,117, filed on Oct. 28, 2011.

(51) Int. Cl.
*H01L 21/44* (2006.01)
*H01L 21/768* (2006.01)

(52) U.S. Cl.
CPC ............................. *H01L 21/76876* (2013.01)
USPC .... 438/648; 438/653; 438/654; 257/E21.021; 257/E21.583

(58) Field of Classification Search
USPC ......... 438/618, 625, 627, 630, 642, 648, 653, 438/654, 687, 686; 257/E21.021, E21.583
See application file for complete search history.

(56) References Cited

U.S. PATENT DOCUMENTS

| 5,186,718 A | 2/1993 | Tepman et al. |
| 6,607,976 B2 | 8/2003 | Chen et al. |

(Continued)

FOREIGN PATENT DOCUMENTS

| JP | 2007251164 A | 9/2007 |
| KR | 10-2000-0011786 | 2/2000 |

(Continued)

OTHER PUBLICATIONS

PCT International Search Report and Written Opinion dated Mar. 22, 2013 for International Application No. PCT/US2012/061914.

(Continued)

*Primary Examiner* — Brook Kebede
(74) *Attorney, Agent, or Firm* — Patterson & Sheridan, LLP

(57) ABSTRACT

Embodiments of the invention provide an improved process for depositing tungsten-containing materials. In one embodiment, the method for forming a tungsten-containing material on a substrate includes forming an adhesion layer containing titanium nitride on a dielectric layer disposed on a substrate, forming a tungsten nitride intermediate layer on the adhesion layer, wherein the tungsten nitride intermediate layer contains tungsten nitride and carbon. The method further includes forming a tungsten barrier layer (e.g., tungsten or tungsten-carbon material) from the tungsten nitride intermediate layer by thermal decomposition during a thermal annealing process (e.g., temperature from about 700° C. to less than 1,000° C.). Subsequently, the method includes optionally forming a nucleation layer on the tungsten barrier layer, optionally exposing the tungsten barrier layer and/or the nucleation layer to a reducing agent during soak processes, and forming a tungsten bulk layer on or over the tungsten barrier layer and/or the nucleation layer.

19 Claims, 4 Drawing Sheets

(56) References Cited

U.S. PATENT DOCUMENTS

| | | |
|---|---|---|
| 6,878,206 B2 | 4/2005 | Tzu et al. |
| 7,504,333 B2 | 3/2009 | Jeong et al. |
| 7,507,660 B2 | 3/2009 | Chen et al. |
| 7,595,263 B2 | 9/2009 | Chung et al. |
| 7,732,327 B2 | 6/2010 | Lee et al. |
| 7,883,739 B2 | 2/2011 | Ivanov et al. |
| 7,964,505 B2 | 6/2011 | Khandelwal et al. |
| 2004/0041264 A1* | 3/2004 | Kloster et al. ............ 257/758 |
| 2005/0272254 A1 | 12/2005 | Ding et al. |
| 2006/0094238 A1 | 5/2006 | Levy et al. |
| 2008/0206987 A1 | 8/2008 | Gelatos et al. |
| 2009/0032949 A1 | 2/2009 | Goswami |
| 2009/0081866 A1 | 3/2009 | Lee et al. |

FOREIGN PATENT DOCUMENTS

| | | |
|---|---|---|
| KR | 10-2001-0078247 | 8/2001 |
| KR | 10-2006-0087844 | 8/2006 |

OTHER PUBLICATIONS

Dong Ho You, Soo Hyun Kim, Ki Hoon Lee, Sang Kyu Lee and Tea Wook Seo, WNx Film Prepared by Atomic Layer Deposition using F-Free BTBMW and NH3 Plasma Radical for ULSI Applications, ECS Trans. 2007, vol. 3, Issue 15, pp. 147-152.

D. Fujita and T. Kumakura, Reproducible fabrication of metallic silver nanostructures on a Si(111)-(7X7) surface by tip-material transfer of a scanning tunneling microscope, Applied Physics Letters, vol. 82, No. 14, Apr. 7, 2003.

* cited by examiner

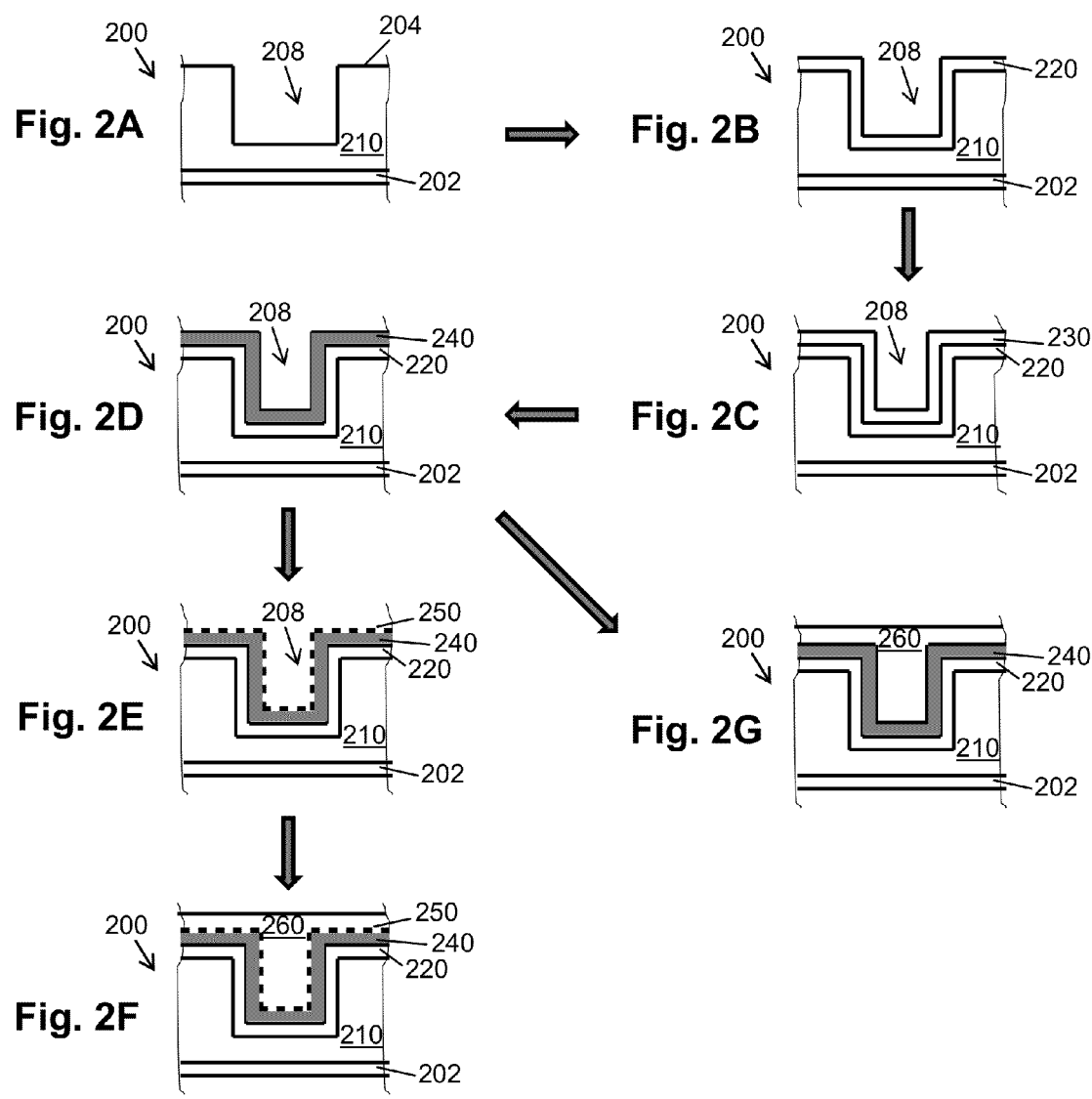

HIGH TEMPERATURE TUNGSTEN METALLIZATION PROCESS

CROSS-REFERENCE TO RELATED APPLICATIONS

This application is a continuation of co-pending U.S. patent application Ser. No. 13/660,463, filed Oct. 25, 2012, which claims benefit of U.S. provisional patent application Ser. No. 61/553,117, filed Oct. 28, 2011. Each of the aforementioned patent applications is herein incorporated by reference.

BACKGROUND OF THE INVENTION

1. Field of the Invention

Embodiments of the invention relate to the processing of substrates, and more particularly relate to methods for forming tungsten materials on substrates using vapor deposition processes.

2. Description of the Related Art

Semiconductor and electronics processing industries continue to strive for larger production yields while increasing the uniformity of layers deposited on substrates having larger surface areas. These same factors in combination with new materials also provide higher integration of circuits per area of the substrate. As circuit integration increases, the need for greater uniformity and process control regarding layer thickness rises. As a result, various technologies have been developed to deposit layers on substrates in a cost-effective manner, while maintaining control over the characteristics of the layer.

Therefore, there is a need for an improved process to deposit tungsten-containing materials with good uniformity using vapor deposition techniques.

SUMMARY OF THE INVENTION

Embodiments of the invention provide an improved process for depositing tungsten-containing materials. The process utilizes soak processes and vapor deposition process to provide tungsten-containing materials having significantly improved conductivity and surface uniformity, while increasing the production level throughput.

In one embodiment, a method for forming a tungsten-containing material on a substrate includes forming an adhesion layer on a dielectric layer (e.g., silicon or silicon oxide materials) disposed on a substrate, forming a tungsten nitride intermediate layer on the adhesion layer, heating the tungsten nitride intermediate layer to a decomposition temperature during a thermal annealing process (e.g., RTP). The tungsten nitride intermediate layer decomposes to form a tungsten barrier layer containing metallic tungsten or tungsten-carbon material at a decomposition temperature within a range from about 700° C. to less than 1,000° C. The method further includes optionally forming a nucleation layer on the tungsten barrier layer and forming a tungsten bulk layer on the nucleation layer. The adhesion layer generally contains a metal or a metal nitride material. In many examples, the adhesion layer contains titanium, titanium nitride, alloys thereof, or combinations thereof. The tungsten nitride intermediate layer generally contains tungsten, nitrogen, and carbon. In some examples, the tungsten nitride intermediate layer further contains oxygen.

In another embodiment, the method for forming a tungsten-containing material on a substrate includes forming an adhesion layer containing titanium nitride on a dielectric layer disposed on a substrate, forming a tungsten nitride intermediate layer on the adhesion layer, wherein the tungsten nitride intermediate layer contains tungsten nitride and carbon, forming a tungsten barrier layer from the tungsten nitride intermediate layer during a thermal annealing process, wherein the tungsten barrier layer contains metallic tungsten or tungsten-carbon material formed by thermal decomposition of the tungsten nitride intermediate layer, optionally forming a nucleation layer on the tungsten barrier layer, and forming a tungsten bulk layer on the nucleation layer.

In another embodiment, the method for forming a tungsten-containing material on a substrate includes heating the tungsten nitride intermediate layer to a decomposition temperature during a thermal annealing process, wherein the tungsten nitride intermediate layer decomposes to form a tungsten barrier layer containing metallic tungsten or tungsten-carbon material and the decomposition temperature is within a range from about 700° C. to less than 1,000° C.

In some examples, the method includes optionally omitting or not forming a nucleation layer on the tungsten barrier layer. Instead, the method includes optionally exposing the tungsten barrier layer to a reducing agent during a soak process and forming a tungsten bulk layer directly on the tungsten barrier layer. In one example, the method includes forming a tungsten bulk layer directly on the tungsten barrier layer without exposing the tungsten barrier layer to a reducing agent during a soak process.

In another embodiment, the method for forming a tungsten-containing material on a substrate includes exposing the tungsten barrier layer to a reducing agent during a pre-soak process, forming a nucleation layer on the tungsten barrier layer, exposing the nucleation layer to the reducing agent during a post-soak process, and forming a tungsten bulk layer on the nucleation layer. The reducing agent utilized during any of the soak processes, such as the pre-soak or post-soak process, generally contains at least one compound selected from silane, disilane, diborane, hydrogen gas ($H_2$), plasmas thereof, derivatives thereof, or combinations thereof.

The adhesion layer generally contains a metal or a metal nitride material, such as titanium, titanium nitride, alloys thereof, or combinations thereof. The adhesion layer has a thickness within a range from about 2 Å to about 100 Å, more narrowly within a range from about 3 Å to about 80 Å, more narrowly within a range from about 4 Å to about 50 Å, more narrowly within a range from about 5 Å to about 25 Å, more narrowly within a range from about 5 Å to about 20 Å, more narrowly within a range from about 5 Å to about 15 Å, and more narrowly within a range from about 5 Å to about 10 Å. The adhesion layer is generally deposited by atomic layer deposition (ALD), plasma-enhanced ALD (PE-ALD), or physical vapor deposition (PVD) processes.

The tungsten nitride intermediate layer generally has a thickness within a range from about 5 Å to about 150 Å, more narrowly within a range from about 10 Å to about 80 Å, and more narrowly within a range from about 30 Å to about 50 Å. The tungsten nitride intermediate layer is generally deposited by ALD, chemical vapor deposition (CVD), or PVD processes. The CVD process utilized to deposit or otherwise form tungsten nitride intermediate layer may include thermal CVD, pulsed-CVD, plasma-enhanced CVD (PE-CVD), or pulsed PE-CVD.

In other examples, the tungsten nitride intermediate layer has a tungsten concentration within a range from about 30 at % (atomic percent) to about 60 at %, a nitrogen concentration within a range from about 30 at % to about 60 at %, a carbon concentration within a range from about 3 at % to about 20 at %, and an oxygen concentration within a range from about 0 at % to about 10 at %, more narrowly, a tungsten concentration within a range from about 35 at % to about 55 at %, a nitrogen concentration within a range from about 35 at % to about 55 at %, a carbon concentration within a range from about 5 at % to about 15 at %, and an oxygen concentration within a range from about 0 at % to about 5 at %. However, once the tungsten nitride intermediate layer is thermally decomposed to form the tungsten barrier layer (e.g., RTP exposure), the subsequent tungsten barrier layer has a tungsten concentration within a range from about 70 at % to about 99.99 at %, a nitrogen concentration within a range from about 0 at % to about 10 at %, a carbon concentration within a range from about 0 at % to about 15 at %, and an oxygen concentration within a range from about 0 at % to about 20 at %, more narrowly, a tungsten concentration within a range from about 80 at % to about 99.9 at %, a nitrogen concentration within a range from about 0 at % to about 5 at %, a carbon concentration within a range from about 0 at % to about 10 at %, and an oxygen concentration within a range from about 0 at % to about 15 at %, and more narrowly, a tungsten concentration within a range from about 85 at % to about 99.9 at %, a nitrogen concentration within a range from about 0 at % to about 2 at %, a carbon concentration within a range from about 0 at % to about 5 at %, and an oxygen concentration within a range from about 5 at % to about 10 at %.

In some examples, the tungsten nitride intermediate layer has a tungsten concentration within a range from about 40 at % to about 60 at %, a nitrogen concentration within a range from about 20 at % to about 40 at %, and a carbon concentration within a range from about 5 at % to about 15 at %, more narrowly, a tungsten concentration within a range from about 45 at % to about 55 at %, a nitrogen concentration within a range from about 25 at % to about 35 at %, and a carbon concentration within a range from about 8 at % to about 12 at %. However, once the tungsten nitride intermediate layer is thermally decomposed to form the tungsten barrier layer, the tungsten concentration of the tungsten barrier layer has increased relative to the tungsten concentration of the corresponding tungsten nitride intermediate layer. Also, the nitrogen and/or carbon concentrations are reduced relative to the nitrogen and/or carbon concentrations of the corresponding tungsten nitride intermediate layer. The nitrogen and/or carbon atoms are completely removed or substantially removed from within the tungsten barrier layer. The thickness of the tungsten barrier layer is less than the thickness of the tungsten nitride intermediate layer. The thickness of the tungsten barrier layer is within a range from about 50% to about 80% the thickness of the tungsten nitride intermediate layer, more narrowly, in a range from about 55% to about 70% the thickness of the tungsten nitride intermediate layer. The tungsten barrier layer has a tungsten concentration within a range from about 70 at % to about 99 at %, a nitrogen concentration within a range from about 1 ppb to about 10 at %, and a carbon concentration within a range from about 1 ppb to about 10 at %, more narrowly, a tungsten concentration within a range from about 70 at % to about 90 at %, a nitrogen concentration within a range from about 1 ppm to about 5 at %, and a carbon concentration within a range from about 1 ppm to about 5 at %. The tungsten barrier layer has an electrical resistivity of less than 200 Ωμ-cm, such as about 100 Ωμ-cm or less, as measured through the full stack including the tungsten bulk layer.

In other examples, the tungsten nitride intermediate layer has a tungsten concentration within a range from about 40 at % to about 60 at %, a nitrogen concentration within a range from about 5 at % to about 20 at %, and a carbon concentration within a range from about 20 at % to about 40 at %, more narrowly, a tungsten concentration within a range from about 45 at % to about 55 at %, a nitrogen concentration within a range from about 8 at % to about 12 at %, and a carbon concentration within a range from about 25 at % to about 35 at %. However, once the tungsten nitride intermediate layer is thermally decomposed to form the tungsten barrier layer, the subsequent tungsten barrier layer has a tungsten concentration within a range from about 70 at % to about 99 at %, a nitrogen concentration within a range from about 1 ppb to about 10 at %, and a carbon concentration within a range from about 1 at % to about 15 at %, more narrowly, a tungsten concentration within a range from about 70 at % to about 90 at %, a nitrogen concentration within a range from about 1 ppm to about 5 at %, and a carbon concentration within a range from about 1 at % to about 10 at %.

In additional examples, the tungsten nitride intermediate layer further contains oxygen and has an oxygen concentration within a range from about 1 at % to about 10 at %. However, once the tungsten nitride intermediate layer is thermally decomposed and the tungsten barrier layer is formed, the subsequent tungsten barrier layer may be free of oxygen or contain oxygen at a concentration of about 1 at % or less, such as about 1 ppm or less, such as about 1 ppb or less. In some examples, the tungsten barrier layer has an oxygen concentration within a range from about 1 ppb to about 1 at %.

In some examples, a tungsten nitride intermediate layer decomposes to form a tungsten barrier layer containing metallic tungsten or tungsten-carbon material at a decomposition temperature within a range from about 700° C. to less than 1,000° C. However, in other examples, the decomposition temperature of the tungsten nitride intermediate layer is more narrowly within a range from about 800° C. to about 950° C., more narrowly within a range from about 850° C. to about 925° C., and more narrowly, in a range from about 875° C. to about 915° C. In some examples, the tungsten nitride intermediate layer is heated to a temperature within a range from about 875° C. to about 915° C., for example, about 900° C., for a time period within a range from about 30 seconds to about 10 minutes during the thermal annealing process, more narrowly within a range from about 1 minute to about 5 minutes during the thermal annealing process.

In some examples, the tungsten nitride intermediate layer is heated to a temperature within a range from about 750° C. to about 850° C. for a time period within a range from about 10 minutes to about 60 minutes during the thermal annealing process. In one example, the tungsten nitride intermediate layer is heated to a temperature of about 800° C. for a time period within a range from about 20 minutes to about 40 minutes during the thermal annealing process.

The nucleation layer generally contains a metal, such as tungsten, cobalt, ruthenium, copper, alloys thereof, derivatives thereof, or combinations thereof. In many examples, nucleation layer contains metallic tungsten, tungsten silicide, tungsten boride, alloys thereof, derivatives thereof, or combinations thereof. The nucleation layer is generally formed by ALD, PE-ALD, PVD, CVD, PE-CVD, or pulsed-CVD. The tungsten bulk layer is generally formed by CVD, pulsed-CVD, PE-CVD, or pulsed PE-CVD.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

FIGS. 2A-2G depict cross-sectional views of a workpiece during steps of the process illustrated in FIG. 1 and according to embodiments described herein.

Appendix A containing 20 pages is attached herein and incorporated by reference in its entirety.

DETAILED DESCRIPTION

Embodiments of the invention provide an improved process for depositing tungsten-containing materials. The process utilizes tungsten containing gas and vapor deposition process to provide tungsten-containing materials having significantly improved conductivity and surface uniformity, while increasing the production level throughput.

Figure 1:
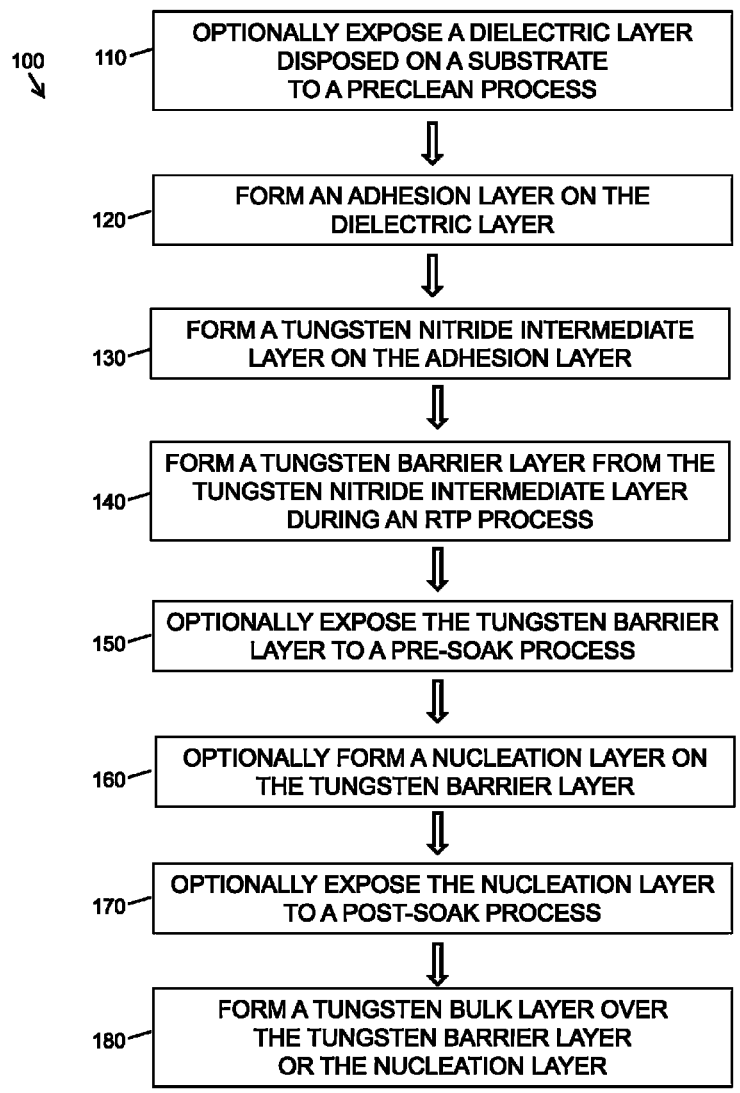
FIG. 1 illustrates a flow chart depicting a process sequence for forming a tungsten-containing material by processes according to embodiments described herein.

FIG. 1 illustrates an exemplary method or process 100 for forming a tungsten-containing material on a substrate, according to embodiments described herein. In one embodiment, process 100 includes optionally exposing a dielectric layer disposed on a substrate to a preclean process (step 110), forming an adhesion layer on the dielectric layer (step 120), forming a tungsten nitride intermediate layer on the adhesion layer (step 130), forming a tungsten barrier layer from the tungsten nitride intermediate layer during a thermal annealing process, such as an RTP (step 140), optionally exposing the tungsten barrier layer to a pre-soak process (step 150), optionally forming a nucleation layer on the tungsten barrier layer (step 160), optionally exposing the nucleation layer to a post-soak process (step 170), and forming a tungsten bulk layer over the tungsten barrier layer or the nucleation layer (step 180).

FIGS. 2A-2G depict exemplary cross-sectional views of workpiece 200 at lapsed process steps after to being processed at different steps of a metallization sequence process, such as steps 110-180 of process 100, as described by some embodiments herein. Process 100 is utilized to form tungsten metallization materials on a substrate surface. In one example, workpieces 200, depicted in FIGS. 2A-2G, may be fabricated or otherwise formed by process 100.

FIG. 2A depicts workpiece 200 that contains a dielectric layer 210 disposed on a substrate 202 and an aperture 208 formed or otherwise contained within dielectric layer 210. Generally, substrate 202 is a silicon substrate or at least contains silicon or a silicon-based material. In many examples, workpiece 200 is a semiconductor workpiece having a silicon substrate or wafer as substrate 202, dielectric layer 210 contains at least one dielectric material, such as silicon, monocrystalline silicon, microcrystalline silicon, polycrystalline silicon (polysilicon), amorphous silicon, hydrogenated amorphous silicon, silicon oxide materials, dopant derivatives thereof, or combinations thereof. Aperture 208 may be vias, trenches, lines, holes, or other apertures utilized in a semiconductor, solar, or other electronic devices, such as high aspect contact plugs.

Upper surface 204 of workpiece 200 may have at least one or more contaminants disposed thereon. Contaminants disposed on upper surface 204 of workpiece 200 may include native oxides, residues, particles, and/or other contaminants. Step 110, an optional step, may be utilized to clean upper surface 204 of workpiece 200, in various embodiments of process 100. Alternatively, step 110 may be excluded in other embodiments of process 100, which then starts with step 120. For example, contaminants are removed from upper surface 204 of workpiece 200 during an optional process step, such as a preclean process or a backside polishing process during step 110. FIG. 2A depicts upper surface 204 of workpiece 200 free of contaminants or substantially free of contaminants, including free of native oxides.

In some embodiments during step 110, upper surface 204 of workpiece 200 may be exposed to a pre-clean process. Upper surface 204 usually contains silicon, polysilicon, or silicon containing surface (e.g., silicide) disposed thereon and may be exposed to pre-clean solution, vapor, or plasma during a pre-clean process. In one embodiment, upper surface 204 is exposed to a reducing agent in gaseous form, such as silane, disilane, diborane, hydrogen, phosphine, or derivatives thereof. A carrier gas may be co-flowed with the reducing agent. Carrier gases include hydrogen, nitrogen, argon, or combinations thereof. In another embodiment, upper surface 204 is exposed to a plasma pre-clean process. The plasma may be generated internal (e.g., in situ plasma) or generated externally (e.g., remote plasma system). Upper surface 204 may be exposed to a plasma formed from a gas or a gaseous mixture containing argon, helium, neon, hydrogen, nitrogen, ammonia, silane, disilane, diborane, or mixtures thereof. In several examples, the plasma may be formed from a hydrogen and ammonia mixture, a hydrogen and nitrogen mixture, or a nitrogen and ammonia mixture.

In step 120 of process 100, the method includes forming an adhesion layer on a dielectric layer disposed on a substrate, as depicted in FIG. 2B. In many examples, adhesion layer 220 contains a metal or a metal nitride material, such as titanium, titanium nitride, alloys thereof, or combinations thereof. Adhesion layer 220 has a thickness within a range from about 2 Å to about 100 Å, more narrowly within a range from about 3 Å to about 80 Å, more narrowly within a range from about 4 Å to about 50 Å, more narrowly within a range from about 5 Å to about 25 Å, more narrowly within a range from about 5 Å to about 20 Å, more narrowly within a range from about 5 Å to about 15 Å, and more narrowly within a range from about 5 Å to about 10 Å. Adhesion layer 220 is generally deposited by atomic layer deposition (ALD) or physical vapor deposition (PVD) processes.

In step 130 of process 100, the method includes forming tungsten nitride intermediate layer 230 on adhesion layer 220, as depicted in FIG. 2C. Tungsten nitride intermediate layer 230 generally contains tungsten, nitrogen, and carbon. For example, tungsten nitride intermediate layer 230 may contain tungsten nitride and carbon, such that carbon atoms are disposed within the lattice of a tungsten nitride material, a tungsten-carbon material, or other a tungsten-containing material. In some examples, tungsten nitride intermediate layer 230 may contain tungsten carbide. In other examples, tungsten nitride intermediate layer 230 further contains oxygen, such that the tungsten nitride intermediate material contains tungsten, nitrogen, carbon, and oxygen.

Tungsten nitride intermediate layer 230 generally has a thickness within a range from about 5 Å to about 150 Å, more narrowly within a range from about 10 Å to about 80 Å, and more narrowly within a range from about 30 Å to about 50 Å. Tungsten nitride intermediate layer 230 is generally deposited by ALD, chemical vapor deposition, or PVD. The CVD process utilized to deposit or otherwise form tungsten nitride intermediate layer may include thermal CVD, pulsed-CVD, plasma-enhanced CVD (PE-CVD), or pulsed PE-CVD.

Vapor deposition processes that may be utilized to deposit or otherwise form tungsten nitride intermediate layer 230 are described in commonly assigned U.S. Pat. Nos. 6,607,976, 7,507,660, 7,595,263, 7,732,327, and 7,964,505, as well as U.S. Pub. No. 2008-0206987, and further described in the NPL references ECS Transactions, 3 (15) 147-152 (2007) and Applied Physics Letters, 82(14) 2239-2241 (2003), which are incorporated herein by reference for disclosure of deposition techniques utilized while depositing or otherwise forming tungsten nitride materials and other tungsten-containing materials.

In step 140 of process 100, the method includes forming tungsten barrier layer 240 from tungsten nitride intermediate layer 230 during a thermal annealing process, as depicted in FIG. 2D. Tungsten barrier layer 240 contains metallic tungsten or tungsten-carbon material formed by thermal decomposition of tungsten nitride intermediate layer 230. The tungsten-carbon material contains metallic tungsten having carbon atoms within the tungsten lattice and in some examples, may have some tungsten carbide. Tungsten barrier layer 240 is formed on and in contact with adhesion layer 220.

In another embodiment, the method for forming tungsten-containing materials on a substrate includes heating tungsten nitride intermediate layer 230 to a decomposition temperature during a thermal annealing process (e.g., RTP). Tungsten nitride intermediate layer 230 decomposes to form tungsten barrier layer 240 containing metallic tungsten or tungsten-carbon material at a decomposition temperature within a range from about 700° C. to less than 1,000° C.

In some examples, tungsten nitride intermediate layer 230 decomposes to form tungsten barrier layer 240 containing metallic tungsten or tungsten-carbon material at a decomposition temperature within a range from about 700° C. to less than 1,000° C. However, in other examples, the decomposition temperature of tungsten nitride intermediate layer 230 is more narrowly within a range from about 800° C. to about 950° C., more narrowly within a range from about 850° C. to about 925° C., and more narrowly, in a range from about 875° C. to about 915° C. In some examples, tungsten nitride intermediate layer 230 is heated to a temperature within a range from about 875° C. to about 915° C., for example, about 900° C., for a time period within a range from about 30 seconds to about 10 minutes during the thermal annealing process, more narrowly within a range from about 1 minute to about 5 minutes during the thermal annealing process.

In further examples, tungsten nitride intermediate layer 230 is heated to a temperature within a range from about 750° C. to about 850° C. for a time period within a range from about 10 minutes to about 60 minutes during the thermal annealing process. In one example, tungsten nitride intermediate layer 230 is heated to a temperature of about 800° C. for a time period within a range from about 20 minutes to about 40 minutes during the thermal annealing process.

In some examples, tungsten nitride intermediate layer 230 has a tungsten concentration within a range from about 40 at % (atomic percent) to about 60 at %, a nitrogen concentration within a range from about 20 at % to about 40 at %, and a carbon concentration within a range from about 5 at % to about 15 at %, more narrowly, a tungsten concentration within a range from about 45 at % to about 55 at %, a nitrogen concentration within a range from about 25 at % to about 35 at %, and a carbon concentration within a range from about 8 at % to about 12 at %.

In other examples, tungsten nitride intermediate layer 230 has a tungsten concentration within a range from about 30 at % to about 60 at %, a nitrogen concentration within a range from about 30 at % to about 60 at %, a carbon concentration within a range from about 3 at % to about 20 at %, and an oxygen concentration within a range from about 0 at % to about 10 at %, more narrowly, a tungsten concentration within a range from about 35 at % to about 55 at %, a nitrogen concentration within a range from about 35 at % to about 55 at %, a carbon concentration within a range from about 5 at % to about 15 at %, and an oxygen concentration within a range from about 0 at % to about 5 at %.

However, once tungsten nitride intermediate layer 230 is thermally decomposed to form tungsten barrier layer 240 at step 240, the tungsten concentration of tungsten barrier layer 240 has increased relative to the tungsten concentration of the corresponding tungsten nitride intermediate layer. Also, the nitrogen and/or carbon concentrations are reduced relative to the nitrogen and/or carbon concentrations of the corresponding tungsten nitride intermediate layer. The nitrogen and/or carbon atoms are completely removed or substantially removed from within tungsten barrier layer 240.

Tungsten barrier layer 240 has a tungsten concentration within a range from about 70 at % to about 99 at %, a nitrogen concentration within a range from about 1 ppb to about 10 at %, and a carbon concentration within a range from about 1 ppb to about 10 at %, more narrowly, a tungsten concentration within a range from about 70 at % to about 90 at %, a nitrogen concentration within a range from about 1 ppm to about 5 at %, and a carbon concentration within a range from about 1 ppm to about 5 at %.

In other examples, tungsten nitride intermediate layer 230 has a tungsten concentration within a range from about 40 at % to about 60 at %, a nitrogen concentration within a range from about 5 at % to about 20 at %, and a carbon concentration within a range from about 20 at % to about 40 at %, more narrowly, a tungsten concentration within a range from about 45 at % to about 55 at %, a nitrogen concentration within a range from about 8 at % to about 12 at %, and a carbon concentration within a range from about 25 at % to about 35 at %. However, once tungsten nitride intermediate layer 230 is thermally decomposed to form tungsten barrier layer 240, the subsequent tungsten barrier layer has a tungsten concentration within a range from about 70 at % to about 99 at %, a nitrogen concentration within a range from about 1 ppb to about 10 at %, and a carbon concentration within a range from about 1 at % to about 15 at %, more narrowly, a tungsten concentration within a range from about 70 at % to about 90 at %, a nitrogen concentration within a range from about 1 ppm to about 5 at %, and a carbon concentration within a range from about 1 at % to about 10 at %.

In additional examples, tungsten nitride intermediate layer 230 further contains oxygen and has an oxygen concentration within a range from about 1 at % to about 10 at %. However, once tungsten nitride intermediate layer 230 is thermally decomposed and tungsten barrier layer 240 is formed, the subsequent tungsten barrier layer 240 may be free of oxygen or contain oxygen at a concentration of about 1 at % or less, such as about 1 ppm or less, such as about 1 ppb or less. In some examples, tungsten barrier layer 240 has an oxygen concentration within a range from about 1 ppb to about 1 at %.

In other examples, tungsten barrier layer 240 has a tungsten concentration within a range from about 70 at % to about 99.99 at %, a nitrogen concentration within a range from about 0 at % to about 10 at %, a carbon concentration within a range from about 0 at % to about 15 at %, and an oxygen concentration within a range from about 0 at % to about 20 at %, more narrowly, a tungsten concentration within a range from about 80 at % to about 99.9 at %, a nitrogen concentration within a range from about 0 at % to about 5 at %, a carbon concentration within a range from about 0 at % to about 10 at %, and an oxygen concentration within a range from about 0 at % to about 15 at %, and more narrowly, a tungsten concentration within a range from about 85 at % to about 99.9 at %, a nitrogen concentration within a range from about 0 at % to about 2 at %, a carbon concentration within a range from about 0 at % to about 5 at %, and an oxygen concentration within a range from about 5 at % to about 10 at %.

The thickness of tungsten barrier layer 240 is less than the thickness of tungsten nitride intermediate layer 230. The thickness of tungsten barrier layer 240 is within a range from about 50% to about 80% the thickness of tungsten nitride intermediate layer 230, more narrowly within a range from about 55% to about 70% the thickness of tungsten nitride intermediate layer 230. Tungsten barrier layer 240 has an electrical resistivity of less than 200 $\Omega\mu$-cm, such as about 100 $\Omega\mu$-cm or less, as measured through the full stack including tungsten bulk layer 260.

In step 150 of process 100, the method includes optionally exposing tungsten barrier layer 240 to at least one reducing agent during a pre-soak process. The reducing agent generally contains at least one compound selected from silane, disilane, diborane, hydrogen gas ($H_2$), plasmas thereof, derivatives thereof, or combinations thereof.

In some embodiments during step 150, workpiece 200 may be optionally exposed to a reducing gas containing a reducing agent and an optional carrier gas during the pre-soak process. The pre-soak process is generally a thermal process, but may be a plasma process. The reducing agent adsorbs and/or reacts to workpiece 200 containing tungsten barrier layer 240 to form a treated surface. The treated surface provides a quicker deposition process for a subsequently deposited material. The reducing agents may include silane compounds, borane compounds, phosphine compounds, ammonia, amine compounds, hydrogen, derivatives thereof, or combinations thereof. Silane compounds include silane, disilane, trisilane, tetrasilane, chlorosilane, dichlorosilane, tetrachlorosilane, hexachlorodisilane, or derivatives thereof, while borane compounds include borane, diborane, triborane, tetraborane, pentaborane, alkylboranes, such as triethylborane, or derivatives thereof. Some specific reductants include silane, disilane, diborane, hydrogen, derivatives thereof, or combinations thereof. A carrier gas may be co-flowed with the reducing agent. Carrier gases include hydrogen, nitrogen, argon, helium, or combinations thereof.

The surface of workpiece 200, such as tungsten barrier layer 240, may be exposed to the pre-soak gas or reducing gas during the pre-soak process in step 150 for a time period within a range from about 1 second to about 90 seconds, more narrowly within a range from about 5 seconds to about 60 seconds, more narrowly within a range from about 10 seconds to about 30 seconds, and more narrowly within a range from about 15 seconds to about 20 seconds. Tungsten barrier layer 240 on workpiece 200 may be exposed to a pre-soak gas while workpiece 200 is heated to a temperature within a range from about 100° C. to about 600° C., more narrowly within a range from about 200° C. to about 600° C., more narrowly within a range from about 300° C. to about 500° C., more narrowly within a range from about 350° C. to about 420° C., and narrowly within a range from about 375° C. to about 500° C. during the pre-soak process. The processing chamber may have internal pressure within a range from about 0.1 Torr to about 150 Torr, more narrowly within a range from about 1 Torr to about 100 Torr, more narrowly within a range from about 10 Torr to about 50 Torr, and more narrowly within a range from about 20 Torr to about 40 Torr. Tungsten barrier layer 240 disposed on or over workpiece 200 may be reduced and/or adsorbs the reducing agent to form a conditioned layer for the subsequent nucleation layer.

In step 160 of process 100, the method includes optionally forming a nucleation layer 250 on tungsten barrier layer 240, as depicted in FIG. 2E. In some examples, the method includes optionally not forming a nucleation layer on tungsten barrier layer 240, exposing tungsten barrier layer 240 to a reducing agent during a soak process, and forming a tungsten bulk layer directly on tungsten barrier layer 240.

Nucleation layer 250 generally contains a metal, such as tungsten, cobalt, ruthenium, copper, alloys thereof, derivatives thereof, or combinations thereof. In many examples, nucleation layer contains metallic tungsten, tungsten silicide, tungsten boride, alloys thereof, derivatives thereof, or combinations thereof. Nucleation layer 250 is generally formed by ALD, PE-ALD, PVD, thermal CVD, PE-CVD, pulsed-CVD, or pulsed PE-CVD.

Alternatively, in another embodiment described herein, step 160 may be skipped and a tungsten bulk layer 260 is directly deposited or otherwise formed on tungsten barrier layer 240, with or without a soak process, as depicted in FIG. 2G. Therefore, the method of process 100 includes optionally omitting or not forming nucleation layer 250 on tungsten barrier layer 240. Instead, the method of process 100 provides optionally exposing tungsten barrier layer 240 to a reducing agent during a soak process and depositing or otherwise forming tungsten bulk layer 260 directly on tungsten barrier layer 240. In one example, the method or process 100 includes depositing or otherwise forming tungsten bulk layer 260 directly on tungsten barrier layer 240 without exposing tungsten barrier layer 240 to a reducing agent during a soak process.

In some embodiment during step 160, nucleation layer 250 is deposited on or over tungsten barrier layer 240. For example, nucleation layer 250 may be deposited or otherwise formed by a vapor deposition process such as ALD, CVD, and/or pulsed-CVD. The processing chamber used to deposit nucleation layer 250 may be the same processing chamber used in the soak processes as described in steps 240 and 260. Nucleation layer 250 may contain metallic tungsten, tungsten boride, tungsten silicide, other tungsten alloys, derivatives thereof, or combinations thereof.

Nucleation layer 250 typically has a thickness within a range from about 2 Å to about 200 Å. In many examples, nucleation layer 250 has a thickness within a range from about 2 Å to about 50 Å, more narrowly within a range from about 3 Å to about 30 Å, more narrowly within a range from about 4 Å to about 20 Å, and more narrowly within a range from about 5 Å to about 10 Å.

In one example, nucleation layer 250 is deposited or otherwise formed on tungsten barrier layer 240 which is sequentially exposed to tungsten hexafluoride and reducing agent (e.g., silane or diborane) during an ALD process. In another example, nucleation layer 250 is deposited or otherwise formed on tungsten barrier layer 240 which is simultaneously exposed to tungsten hexafluoride and reducing agent (e.g., silane or diborane) during a pulsed-CVD process.

In step 170 of process 100, the method includes optionally exposing nucleation layer 250 to a reducing agent during a post-soak process. The reducing agent may be the same reducing agent utilized in step 150 during the pre-soak process or may be a different reducing agent. The reducing agent contains at least one compound selected from silane, disilane, diborane, hydrogen gas ($H_2$), plasmas thereof, derivatives thereof, or combinations thereof.

In some embodiments during step 170, workpiece 200 may be optionally exposed to a reducing gas containing a reducing agent and an optional carrier gas during the post-soak process. The post-soak process is generally a thermal process, but may be a plasma process. The reducing agent adsorbs and/or reacts to workpiece 200 containing nucleation layer 250 or tungsten barrier layer 240 to form a treated surface. The treated surface provides a quicker deposition process for a subsequently deposited material. The reducing agents may include silane compounds, borane compounds, phosphine compounds, ammonia, amine compounds, hydrogen, derivatives thereof, or combinations thereof. Silane compounds include silane, disilane, trisilane, tetrasilane, chlorosilane, dichlorosilane, tetrachlorosilane, hexachlorodisilane, or derivatives thereof, while borane compounds include borane, diborane, triborane, tetraborane, pentaborane, alkylboranes, such as triethylborane, or derivatives thereof. Some specific reductants include silane, disilane, diborane, hydrogen, derivatives thereof, or combinations thereof. A carrier gas may be co-flowed with the reducing agent. Carrier gases include hydrogen, nitrogen, argon, helium, or combinations thereof.

The surface of workpiece 200, such as nucleation layer 250 or tungsten barrier layer 240, may be exposed to the post-soak gas or reducing gas during the post-soak process in step 170 for a time period within a range from about 1 second to about 90 seconds, more narrowly within a range from about 5 seconds to about 60 seconds, more narrowly within a range from about 10 seconds to about 30 seconds, and more narrowly within a range from about 15 seconds to about 20 seconds. Nucleation layer 250 or tungsten barrier layer 240 disposed on workpiece 200 may be exposed to a post-soak gas while workpiece 200 is heated to a temperature within a range from about 100° C. to about 600° C., more narrowly within a range from about 200° C. to about 600° C., more narrowly within a range from about 300° C. to about 500° C., more narrowly within a range from about 350° C. to about 420° C., and narrowly within a range from about 375° C. to about 500° C. during the post-soak process. The processing chamber may have internal pressure within a range from about 0.1 Torr to about 150 Torr, more narrowly within a range from about 1 Torr to about 100 Torr, more narrowly within a range from about 10 Torr to about 50 Torr, and more narrowly within a range from about 20 Torr to about 40 Torr. Nucleation layer 250 or tungsten barrier layer 240 disposed on or over workpiece 200 may be reduced and/or adsorbs the reducing agent to form a conditioned layer for the subsequent nucleation layer.

In step 180 of process 100, the method includes forming a tungsten bulk layer 260 on nucleation layer 250, as depicted in FIG. 2F. Generally, the remaining volume of aperture 208 is completely filled with tungsten bulk layer 260 during step 180. Tungsten bulk layer 260 is usually free of voids or cavities within the buried word/bit-line trench. Tungsten bulk layer 260 is generally formed by thermal CVD, pulsed-CVD, PE-CVD, or pulsed PE-CVD. Alternatively, as described in other embodiments herein, tungsten bulk layer 260 is directly deposited or otherwise formed on tungsten barrier layer 240, with or without a soak process, as depicted in FIG. 2G.

In one embodiment during step 180, tungsten bulk layer 260 may be deposited on or over nucleation layer 250. Tungsten bulk layer 260 may be deposited by a vapor deposition process that includes CVD or pulsed-CVD. The processing chamber used to deposit tungsten bulk layer 260 may be the same processing chamber used in the post-soak process as described in step 170. Tungsten bulk layer 260 may contain metallic tungsten, tungsten alloys, tungsten-containing materials (e.g., tungsten boride, tungsten silicide, or tungsten phosphide), or combinations thereof.

In one example, tungsten bulk layer 260 may be deposited on or over nucleation layer 250 on workpiece 200 which is simultaneously exposed to tungsten hexafluoride and hydrogen gas during a CVD process. In another example, a PVD process utilizing a tungsten source is used to deposit tungsten bulk layer 260 on or over nucleation layer 250. Processes for soaking nucleation layer 250 and depositing tungsten bulk layer 260 thereon are further described in the commonly assigned U.S. Pat. No. 6,156,382, which is incorporated herein by reference.

In another embodiment described herein, a buried wordline trench or a buried bitline trench is etched into a substrate, such as a silicon substrate, and then filled with the tungsten materials as described herein. Page 20 of Appendix A is entitled "Buried Wordline Trench Structure" and is incorporated herein by reference in its entirety. Page 20 depicts a buried wordline trench or a buried bitline trench etched into silicon substrate. An etch stop layer containing silicon nitride or other material may be disposed on the substrate. A trench liner is formed on the surfaces of the trench. In some examples, the trench liner is a dielectric trench liner, such as a layer containing silicon oxide (e.g., thermal silicon oxide). The buried word/bit-line trench generally has a depth within a range from about 50 nm to about 500 nm, such as about 100 nm to about 300 nm, for example, about 180 nm within the substrate.

In other embodiments described herein, process 100, including steps 120-180, is utilized to form tungsten metallization materials within the buried word/bit-line trench formed within or on the substrate. In one example, a workpiece contains an aperture etched or otherwise formed within a substrate, such as a silicon substrate. The aperture may be a trench, such as a buried wordline trench or a buried bitline trench, referred herein as a buried word/bit-line trench. The upper surface of the substrate may optional contain one or more layers which the aperture or trench is also formed through. In one example, an etch stop layer (e.g., containing silicon nitride) is disposed on the supper surface of the substrate and the buried word/bit-line trench is formed through the etch stop layer and into the substrate.

In step 120 of process 100, the method includes forming an adhesion layer within the buried word/bit-line trench and/or on the dielectric trench liner formed within the buried word/bit-line trench. The adhesion layer generally contains a metal or a metal nitride material, such as titanium, titanium nitride, alloys thereof, or combinations thereof. The adhesion layer has a thickness within a range from about 2 Å to about 100 Å, more narrowly within a range from about 3 Å to about 80 Å, more narrowly within a range from about 4 Å to about 50 Å, more narrowly within a range from about 5 Å to about 25 Å, more narrowly within a range from about 5 Å to about 20 Å, more narrowly within a range from about 5 Å to about 15 Å, and more narrowly within a range from about 5 Å to about 10 Å. The adhesion layer is generally deposited by ALD or PVD processes.

In step 130 of process 100, the method includes forming a tungsten nitride intermediate layer on the adhesion layer within the buried word/bit-line trench. The tungsten nitride intermediate layer generally contains tungsten, nitrogen, carbon, and oxygen. For example, the tungsten nitride intermediate layer may contain tungsten nitride and carbon, such that carbon atoms are disposed within the lattice of a tungsten nitride material, a tungsten-carbon material, or other a tungsten-containing material. In some examples, the tungsten nitride intermediate layer may contain tungsten carbide. In other examples, the tungsten nitride intermediate layer further contains oxygen, such that the tungsten nitride intermediate material contains tungsten, nitrogen, carbon, and oxygen.

The tungsten nitride intermediate layer generally has a thickness within a range from about 5 Å to about 150 Å, more narrowly within a range from about 10 Å to about 80 Å, and more narrowly within a range from about 30 Å to about 50 Å. The tungsten nitride intermediate layer is generally deposited by ALD, chemical vapor deposition, or PVD. The CVD process utilized to deposit or otherwise form tungsten nitride intermediate layer may include thermal CVD, pulsed-CVD, plasma-enhanced CVD (PE-CVD), or pulsed PE-CVD.

In step 140 of process 100, the method includes forming the tungsten barrier layer from the tungsten nitride intermediate layer within the buried word/bit-line trench during a thermal annealing process, such as an RTP. The tungsten barrier layer contains metallic tungsten or tungsten-carbon material formed by thermal decomposition of the tungsten nitride intermediate layer. The tungsten-carbon material contains metallic tungsten having carbon atoms within the tungsten lattice and in some examples, may have some tungsten carbide. The tungsten barrier layer is formed on and in contact with the adhesion layer.

In another embodiment, the method for forming tungsten-containing materials within the buried word/bit-line trench formed in the substrate includes heating the tungsten nitride intermediate layer to a decomposition temperature during a thermal annealing process (e.g., RTP). The tungsten nitride intermediate layer decomposes to form the tungsten barrier layer containing metallic tungsten or tungsten-carbon material at a decomposition temperature within a range from about 700° C. to less than 1,000.

In some examples, the tungsten nitride intermediate layer decomposes to form the tungsten barrier layer containing metallic tungsten or tungsten-carbon material at a decomposition temperature within a range from about 700° C. to less than 1,000° C. However, in other examples, the decomposition temperature of the tungsten nitride intermediate layer is more narrowly within a range from about 800° C. to about 950° C., more narrowly within a range from about 850° C. to about 925° C., and more narrowly, in a range from about 875° C. to about 915° C. In some examples, the tungsten nitride intermediate layer is heated to a temperature within a range from about 875° C. to about 915° C., for example, about 900° C., for a time period within a range from about 30 seconds to about 10 minutes during the thermal annealing process, more narrowly within a range from about 1 minute to about 5 minutes during the thermal annealing process.

In further examples, the tungsten nitride intermediate layer is heated to a temperature within a range from about 750° C. to about 850° C. for a time period within a range from about 10 minutes to about 60 minutes while forming the tungsten barrier layer during the thermal annealing process. In one example, the tungsten nitride intermediate layer is heated to a temperature of about 800° C. for a time period within a range from about 20 minutes to about 40 minutes while forming the tungsten barrier layer during the thermal annealing process.

In some examples, the tungsten nitride intermediate layer has a tungsten concentration within a range from about 30 at % to about 60 at %, a nitrogen concentration within a range from about 30 at % to about 60 at %, a carbon concentration within a range from about 3 at % to about 20 at %, and an oxygen concentration within a range from about 0 at % to about 10 at %, more narrowly, a tungsten concentration within a range from about 35 at % to about 55 at %, a nitrogen concentration within a range from about 35 at % to about 55 at %, a carbon concentration within a range from about 5 at % to about 15 at %, and an oxygen concentration within a range from about 0 at % to about 5 at %.

However, once the tungsten nitride intermediate layer is thermally decomposed to form the tungsten barrier layer at step 240, the tungsten concentration of the tungsten barrier layer has increased relative to the tungsten concentration of the corresponding tungsten nitride intermediate layer. Also, the nitrogen and/or carbon concentrations are reduced relative to the nitrogen and/or carbon concentrations of the corresponding tungsten nitride intermediate layer. The nitrogen and/or carbon atoms are completely removed or substantially removed from within the tungsten barrier layer.

In some examples, the tungsten barrier layer has a tungsten concentration within a range from about 70 at % to about 99.99 at %, a nitrogen concentration within a range from about 0 at % to about 10 at %, a carbon concentration within a range from about 0 at % to about 15 at %, and an oxygen concentration within a range from about 0 at % to about 20 at %, more narrowly, a tungsten concentration within a range from about 80 at % to about 99.9 at %, a nitrogen concentration within a range from about 0 at % to about 5 at %, a carbon concentration within a range from about 0 at % to about 10 at %, and an oxygen concentration within a range from about 0 at % to about 15 at %, and more narrowly, a tungsten concentration within a range from about 85 at % to about 99.9 at %, a nitrogen concentration within a range from about 0 at % to about 2 at %, a carbon concentration within a range from about 0 at % to about 5 at %, and an oxygen concentration within a range from about 5 at % to about 10 at %.

The thickness of the tungsten barrier layer is less than the thickness of the tungsten nitride intermediate layer. The thickness of the tungsten barrier layer is within a range from about 50% to about 80% the thickness of the tungsten nitride intermediate layer, more narrowly within a range from about 55% to about 70% the thickness of the tungsten nitride intermediate layer. The tungsten barrier layer has an electrical resistivity of less than 200 Ωµ-cm, such as about 100 Ωµ-cm or less, as measured through the full stack including the tungsten bulk layer.

In step 150 of process 100, the method includes optionally exposing the tungsten barrier layer within the buried word/bit-line trench to at least one reducing agent during a pre-soak process. The reducing agent generally contains at least one compound selected from silane, disilane, diborane, hydrogen gas ($H_2$), plasmas thereof, derivatives thereof, or combinations thereof.

In some embodiments during step 150, the workpiece containing the buried word/bit-line trenches formed within the substrate may be optionally exposed to a reducing gas containing a reducing agent and an optional carrier gas during the pre-soak process. The pre-soak process is generally a thermal process, but may be a plasma process. The reducing agent adsorbs and/or reacts to the workpiece containing the tungsten barrier layer to form a treated surface. The treated surface provides a quicker deposition process for a subsequently deposited material. The reducing agents may include silane compounds, borane compounds, phosphine compounds, ammonia, amine compounds, hydrogen, derivatives thereof, or combinations thereof. Silane compounds include silane, disilane, trisilane, tetrasilane, chlorosilane, dichlorosilane, tetrachlorosilane, hexachlorodisilane, or derivatives thereof, while borane compounds include borane, diborane, triborane, tetraborane, pentaborane, alkylboranes, such as triethylborane, or derivatives thereof. Some specific reductants include silane, disilane, diborane, hydrogen, derivatives thereof, or combinations thereof. A carrier gas may be co-flowed with the reducing agent. Carrier gases include hydrogen, nitrogen, argon, helium, or combinations thereof.

The surface of the workpiece, such as the tungsten barrier layer within the buried word/bit-line trench, may be exposed to the pre-soak gas or reducing gas during the pre-soak process in step 150 for a time period within a range from about 1 second to about 90 seconds, more narrowly within a range from about 5 seconds to about 60 seconds, more narrowly within a range from about 10 seconds to about 30 seconds, and more narrowly within a range from about 15 seconds to about 20 seconds. The tungsten barrier layer on the workpiece may be exposed to a pre-soak gas while the workpiece is heated to a temperature within a range from about 100° C. to about 600° C., more narrowly within a range from about 200° C. to about 600° C., more narrowly within a range from about 300° C. to about 500° C., more narrowly within a range from about 350° C. to about 420° C., and narrowly within a range from about 375° C. to about 500° C. during the pre-soak process. The processing chamber may have internal pressure within a range from about 0.1 Torr to about 150 Torr, more narrowly within a range from about 1 Torr to about 100 Torr, more narrowly within a range from about 10 Torr to about 50 Torr, and more narrowly within a range from about 20 Torr to about 40 Torr. The tungsten barrier layer disposed on or over the workpiece may be reduced and/or adsorbs the reducing agent to form a conditioned layer for the subsequent nucleation layer.

In step 160 of process 100, the method includes optionally forming a the nucleation layer on the tungsten barrier layer within the buried word/bit-line trench. In some examples, the method includes optionally not forming a nucleation layer on the tungsten barrier layer, exposing the tungsten barrier layer to a reducing agent during a soak process, and forming a tungsten bulk layer directly on the tungsten barrier layer within the buried word/bit-line trench.

The nucleation layer generally contains a metal, such as tungsten, cobalt, ruthenium, copper, alloys thereof, derivatives thereof, or combinations thereof. In many examples, nucleation layer contains metallic tungsten, tungsten silicide, tungsten boride, alloys thereof, derivatives thereof, or combinations thereof. The nucleation layer is generally formed by ALD, PE-ALD, PVD, thermal CVD, PE-CVD, pulsed-CVD, or pulsed PE-CVD.

Alternatively, in another embodiment described herein, step 160 may be skipped and a the tungsten bulk layer is directly deposited or otherwise formed on the tungsten barrier layer, with or without a soak process, within the buried word/bit-line trench. Therefore, the method of process 100 includes optionally omitting or not forming the nucleation layer on the tungsten barrier layer within the buried word/bit-line trench. Instead, the method of process 100 provides optionally exposing the tungsten barrier layer to a reducing agent during a soak process and depositing or otherwise forming the tungsten bulk layer directly on the tungsten barrier layer within the buried word/bit-line trench. In one example, the method or process 100 includes depositing or otherwise forming the tungsten bulk layer directly on the tungsten barrier layer within the buried word/bit-line trench without exposing the tungsten barrier layer to a reducing agent during a soak process.

In some embodiment during step 160, the nucleation layer is deposited on or over the tungsten barrier layer within the buried word/bit-line trench. For example, the nucleation layer may be deposited or otherwise formed by a vapor deposition process such as ALD, CVD, and/or pulsed-CVD. The processing chamber used to deposit the nucleation layer may be the same processing chamber used in the soak processes as described in steps 240 and 260. The nucleation layer may contain metallic tungsten, tungsten boride, tungsten silicide, other tungsten alloys, derivatives thereof, or combinations thereof.

The nucleation layer typically has a thickness within a range from about 2 Å to about 200 Å. In many examples, the nucleation layer has a thickness within a range from about 2 Å to about 50 Å, more narrowly within a range from about 3 Å to about 30 Å, more narrowly within a range from about 4 Å to about 20 Å, and more narrowly within a range from about 5 Å to about 10 Å.

In one example, the nucleation layer is deposited or otherwise formed on the tungsten barrier layer within the buried word/bit-line trench and the tungsten barrier layer is sequentially exposed to tungsten hexafluoride and reducing agent (e.g., silane or diborane) during an ALD process. In another example, the nucleation layer is deposited or otherwise formed on the tungsten barrier layer which is simultaneously exposed to tungsten hexafluoride and reducing agent (e.g., silane or diborane) during a pulsed-CVD process.

In step 170 of process 100, the method includes optionally exposing the nucleation layer within the buried word/bit-line trench to a reducing agent during a post-soak process. The reducing agent may be the same reducing agent utilized in step 150 during the pre-soak process or may be a different reducing agent. The reducing agent contains at least one compound selected from silane, disilane, diborane, hydrogen gas ($H_2$), plasmas thereof, derivatives thereof, or combinations thereof.

In some embodiments during step 170, the workpiece having within the buried word/bit-line trench, may be optionally exposed to a reducing gas containing a reducing agent and an optional carrier gas during the post-soak process. The post-soak process is generally a thermal process, but may be a plasma process. The reducing agent adsorbs and/or reacts to the workpiece containing the nucleation layer or the tungsten barrier layer to form a treated surface within the buried word/bit-line trench. The treated surface provides a quicker deposition process for a subsequently deposited material. The reducing agents may include silane compounds, borane compounds, phosphine compounds, ammonia, amine compounds, hydrogen, derivatives thereof, or combinations thereof. Silane compounds include silane, disilane, trisilane, tetrasilane, chlorosilane, dichlorosilane, tetrachlorosilane, hexachlorodisilane, or derivatives thereof, while borane compounds include borane, diborane, triborane, tetraborane, pentaborane, alkylboranes, such as triethylborane, or derivatives thereof. Some specific reductants include silane, disilane, diborane, hydrogen, derivatives thereof, or combinations thereof. A carrier gas may be co-flowed with the reducing agent. Carrier gases include hydrogen, nitrogen, argon, helium, or combinations thereof.

The surface of the workpiece, such as the nucleation layer or the tungsten barrier layer within the buried word/bit-line trench, may be exposed to the post-soak gas or reducing gas during the post-soak process in step 170 for a time period within a range from about 1 second to about 90 seconds, more narrowly within a range from about 5 seconds to about 60 seconds, more narrowly within a range from about 10 seconds to about 30 seconds, and more narrowly within a range from about 15 seconds to about 20 seconds. The nucleation layer or the tungsten barrier layer disposed on the workpiece may be exposed to a post-soak gas while the workpiece is heated to a temperature within a range from about 100° C. to about 600° C., more narrowly within a range from about 200° C. to about 600° C., more narrowly within a range from about 300° C. to about 500° C., more narrowly within a range from about 350° C. to about 420° C., and narrowly within a range from about 375° C. to about 500° C. during the post-soak process. The processing chamber may have internal pressure within a range from about 0.1 Torr to about 150 Torr, more narrowly within a range from about 1 Torr to about 100 Torr, more narrowly within a range from about 10 Torr to about 50 Torr, and more narrowly within a range from about 20 Torr to about 40 Torr. The nucleation layer or the tungsten barrier layer disposed on or over the workpiece may be reduced and/or adsorbs the reducing agent to form a conditioned layer for the subsequent nucleation layer.

In step 180 of process 100, the method includes forming a tungsten bulk layer on the nucleation layer within the buried word/bit-line trench. Generally, the remaining volume of the buried word/bit-line trench is completely filled with the tungsten bulk layer during step 180. The tungsten bulk layer is usually free of voids or cavities within the buried word/bit-line trench. The tungsten bulk layer is generally formed by thermal CVD, pulsed-CVD, PE-CVD, or pulsed PE-CVD. Alternatively, as described in other embodiments herein, the tungsten bulk layer is directly deposited or otherwise formed (with or without a soak process) on the tungsten barrier layer within the buried word/bit-line trench.

In one embodiment during step 180, the tungsten bulk layer may be deposited on or over the nucleation layer within the buried word/bit-line trench. The tungsten bulk layer may be deposited by a vapor deposition process that includes CVD or pulsed-CVD. The processing chamber used to deposit the tungsten bulk layer may be the same processing chamber used in the post-soak process as described in step 170. The tungsten bulk layer may contain metallic tungsten, tungsten alloys, tungsten-containing materials (e.g., tungsten boride, tungsten silicide, or tungsten phosphide), or combinations thereof.

In one example, the tungsten bulk layer may be deposited on or over the nucleation layer within the buried word/bit-line trench in the substrate of the workpiece which is simultaneously exposed to tungsten hexafluoride and hydrogen gas during a CVD process. In another example, a PVD process utilizing a tungsten source is used to deposit the tungsten bulk layer on or over the nucleation layer within the buried word/bit-line trench.

A vapor deposition processing chamber used during embodiments described herein is available from Applied Materials, Inc., located in Santa Clara, Calif. Software routines are executed to initiate process recipes or sequences. The software routines, when executed, transform the general purpose computer into a specific process computer that controls the chamber operation so that a chamber process is performed during the deposition process. For example, software routines may be used to precisely control the activation of the electronic control valves for the execution of process sequences according to pulsed-CVD and ALD processes described by embodiments herein. Alternatively, the software routines may be performed in hardware, as an application specific integrated circuit or other types of hardware implementation, or a combination of software or hardware.

Process Integration

A tungsten-containing layer and barrier layer as described above has shown particular utility when integrated with traditional nucleation fill techniques to form features with excellent film properties. An integration scheme can include ALD, CVD, pulsed-CVD processes, plasma-enhanced CVD, or pulsed PE-CVD, to deposit tungsten-containing layers and barrier layers while a nucleation layer may be deposited by ALD process. Integrated processing systems capable of performing such an integration scheme include ENDURA®, ENDURA SL®, CENTURA®, or PRODUCER® processing systems, each available from Applied Materials, Inc., located in Santa Clara, Calif. Any of these systems may be configured to include at least one ALD chamber for depositing the tungsten-containing layer and barrier layer, at least one ALD or pulsed-CVD chamber for depositing the nucleation layer, at least one CVD chamber for depositing bulk fill, and/or at least one PVD chamber for additional materials. In one embodiment, one ALD or CVD chamber may be configured to perform all vapor deposition processes related to the tungsten-containing layers.

Figure 3A:
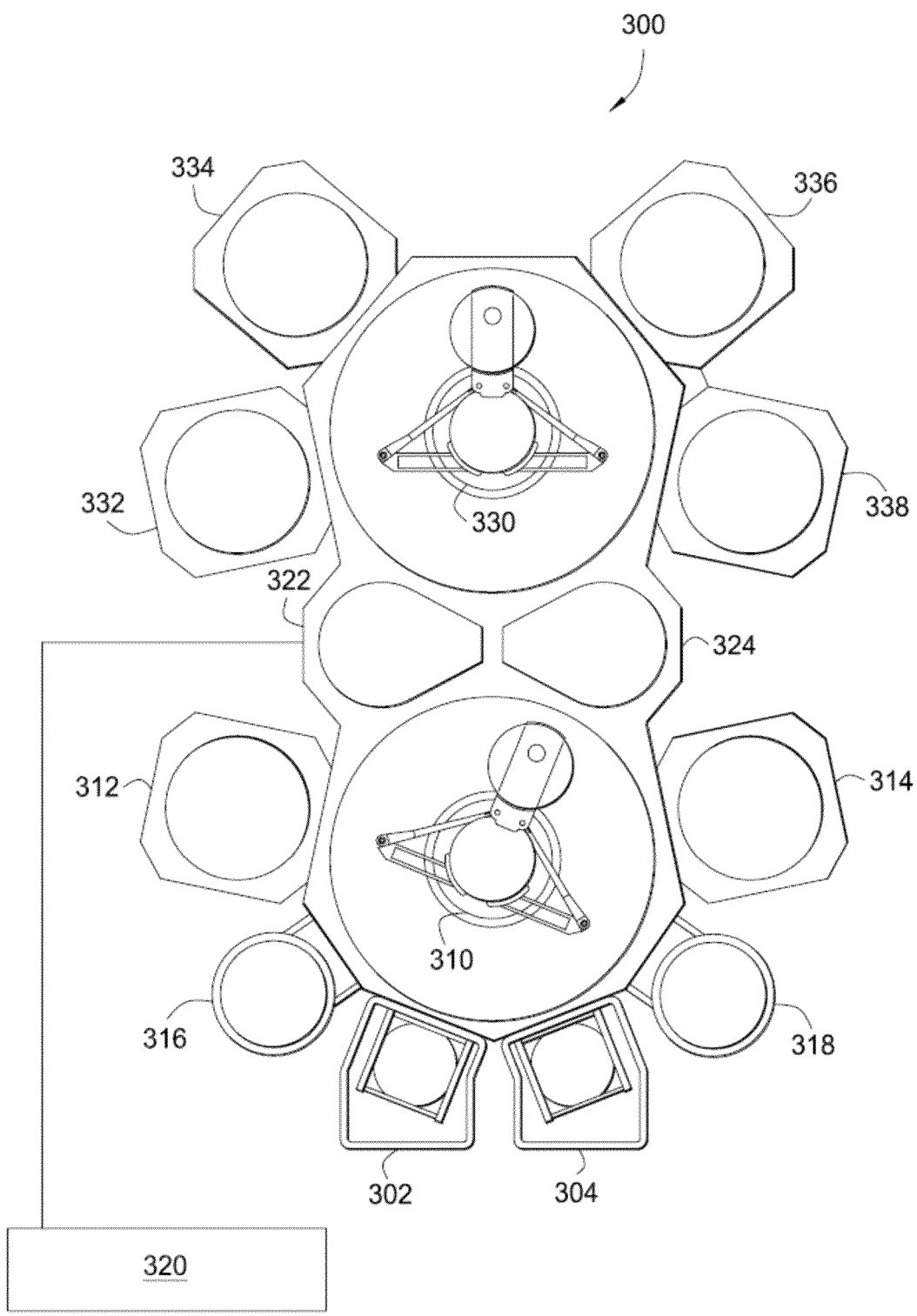
FIGS. 3A-3B depict multi-chamber processing systems according to embodiments described herein.

FIG. 3A depicts a schematic top-view diagram of an exemplary multi-chamber processing system 300. A similar multi-chamber processing system is disclosed in commonly assigned U.S. Pat. No. 5,186,718, which is incorporated by reference herein. Processing system 300 generally includes load lock chambers 302 and 304 for the transfer of substrates into and out from processing system 300. Typically, since processing system 300 is under vacuum, load lock chambers 302 and 304 may "pump down" the substrates introduced into processing system 300. First robot 310 may transfer the substrates between load lock chambers 302 and 304, and a first set of one or more substrate processing chambers 312, 314, 316, and 318 (four are shown). Each processing chamber 312, 314, 316, and 318, may be outfitted to perform a number of substrate processing operations such as ALD, CVD, PVD, etch, pre-clean, de-gas, orientation, or other substrate processes. First robot 310 also transfers substrates to/from one or more transfer chambers 322 and 324.

Transfer chambers 322 and 324 are used to maintain ultra-high vacuum conditions while allowing substrates to be transferred within processing system 300. Second robot 330 may transfer the substrates between transfer chambers 322 and 324 and a second set of one or more processing chambers 332, 334, 336, and 338. Similar to processing chambers 312, 314, 316, and 318, processing chambers 332, 334, 336, and 338 may be outfitted to perform a variety of substrate processing operations, such as ALD, CVD, PVD, etch, pre-clean, de-gas, or orientation. Any of processing chambers 312, 314, 316, 318, 332, 334, 336, and 338 may be removed from processing system 300 if not necessary for a particular process to be performed by processing system 300. Microprocessor controller 320 may be used to operate all aspects of processing system 300.

In one arrangement, each processing chamber 332 and 338 may be an ALD chamber or other vapor deposition chamber adapted to deposit sequential layers containing different chemical compound. For example, the sequential layers may include a layer, a barrier layer, and a nucleation layer. Processing chambers 334 and 336 may be an ALD chamber, a CVD chamber, or a PVD adapted to form a bulk layer. Processing chambers 312 and 314 may be a PVD chamber, a CVD chamber, or an ALD chamber adapted to deposit a dielectric layer. Also, processing chambers 316 and 318 may be an etch chamber outfitted to etch apertures or openings for interconnect features. This one particular arrangement of processing system 300 is provided to illustrate some embodiments of the invention and should not be used to limit the scope of other embodiments of the invention.

In another integration scheme, one or more ALD chambers are integrated onto a first processing system while one or more bulk layer deposition chambers are integrated onto a second processing system. In this configuration, substrates are first processed in the first system where a layer, a barrier layer and a nucleation layer is deposited on a substrate sequentially. Thereafter, the substrates are moved to the second processing system where bulk deposition occurs.

In yet another integrated system, a system may include nucleation deposition as well as bulk fill deposition in a single chamber. A chamber configured to operate in both an ALD mode as well as a conventional CVD mode may be used in processes described herein. One example of such a chamber is described in commonly assigned U.S. Pat. No. 6,878,206, which is incorporated herein by reference.

Figure 3B:
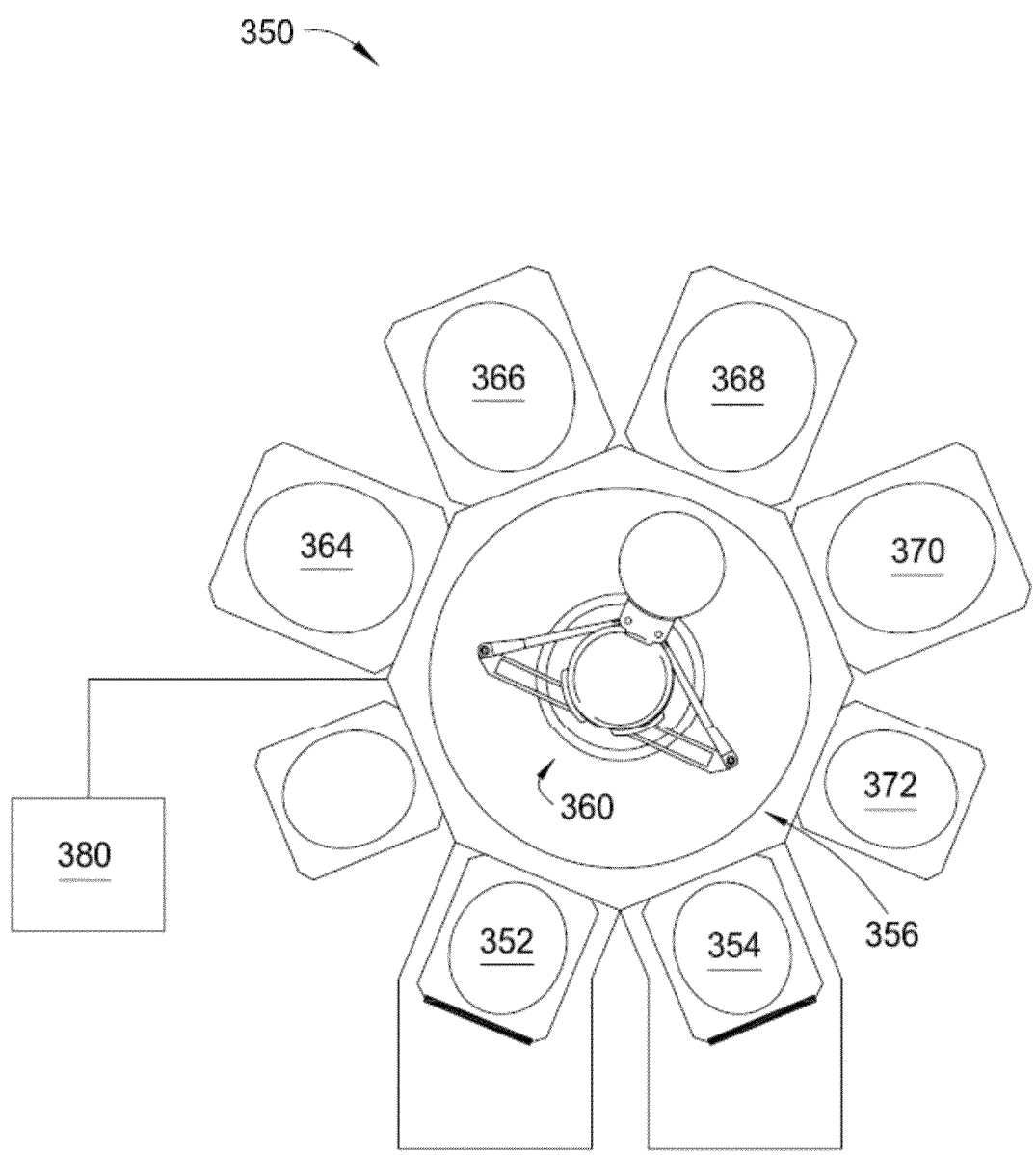

FIG. 3B depicts a multi-chamber processing system 350 that generally includes load lock chambers 352, 354 for the transfer of substrates into and out from processing system 350. Typically, since processing system 350 is under vacuum, load lock chambers 352, 354 may "pump down" the substrates introduced into processing system 350. Robot 360 may transfer the substrates between load lock chambers 352, 354, and processing chambers 364, 366, 368, 370, and 372. Each processing chamber 364, 366, 368, 370, and 372 may be outfitted to perform a number of substrate processing operations such as ALD, CVD, PVD, etch, pre-clean, de-gas, heat, orientation and other substrate processes. Robot 360 also transfers substrates to/from transfer chamber 356. Any of processing chambers 364, 366, 368, 370, and 372 may be removed from processing system 350 if not necessary for a particular process to be performed by processing system 350. Microprocessor controller 380 may be used to operate all aspects of processing system 350.

In one arrangement, each processing chamber 364 and 370 may be an ALD chamber adapted to deposit a nucleation layer, each processing chamber 366 and 368 may be an ALD chamber, a CVD chamber or a PVD chamber adapted to form a bulk fill deposition layer.

In another arrangement, the aforementioned sequential layers may all be deposited in each of processing chamber 364, 366, 368, 370, and 372 as each chamber may be outfitted to perform a number of substrate processing operations such as ALD, CVD, PVD, etch, pre-clean, de-gas, heat, orientation and other substrate processes. The sequential layers may include a layer, a barrier layer, a nucleation layer, and a bulk layer. The different arrangement of processing system 350 mentioned here is provided to illustrate the invention and should not be used to limit the scope of the embodiments herein.

"Substrate surface" or "substrate"—as used herein—refers to any substrate or material surface formed on a substrate upon which film processing is performed during a fabrication process. For example, a substrate surface on which processing may be performed include materials such as silicon, monocrystalline silicon, microcrystalline silicon, polycrystalline silicon (polysilicon), amorphous silicon, hydrogenated amorphous silicon, strained silicon, silicon on insulator (SOI), doped silicon, silicon germanium, germanium, gallium arsenide, glass, sapphire, silicon oxide, silicon nitride, silicon oxynitride, carbon doped silicon oxides, for example, BLACK DIAMOND® low-k dielectric, available from Applied Materials, Inc., located in Santa Clara, Calif., as well as doped variants thereof, derivatives thereof, and/or combinations thereof. Substrates may have various dimensions, such as 200 mm or 300 mm diameter wafers, as well as, rectangular or square panes, such as maybe used for LCDs or solar panel processing. Unless otherwise noted, embodiments and examples described herein may be conducted on substrates with a 200 mm diameter or a 300 mm diameter. Embodiments of the processes described herein may be used to deposit metallic tungsten, tungsten nitride, tungsten carbide, tungsten-carbon material, tungsten boride, tungsten boride nitride, tungsten silicide, tungsten silicide nitride, tungsten phosphide, derivatives thereof, alloys thereof, combinations thereof, or other tungsten-containing materials on many substrates and surfaces, such as adhesion layers (e.g., titanium nitride), or other conductive material layers. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pretreatment process to polish, etch, reduce, oxidize, hydroxylate, anneal, and/or bake the substrate surface.

"Atomic layer deposition" or "cyclical deposition"—as used herein—refers to the sequential introduction of two or more reactive compounds to deposit a layer of material on a substrate surface. The two, three or more reactive compounds may alternatively be introduced into a reaction zone of a processing chamber. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. During each time delay a purge gas, such as argon or nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. In alternative embodiments, the purge gas may also be a reducing agent, such as hydrogen, diborane, or silane. The reactive compounds are alternatively pulsed until a desired film or film thickness is formed on the substrate surface. In either scenario, the ALD process of pulsing compound A, purge gas, pulsing compound B and purge gas is an ALD cycle. A cycle can start with either compound A or compound B and continue the respective order of the cycle until achieving a film with the desired thickness. In another embodiment, a first precursor containing compound A, a second precursor containing compound B, and a third precursor containing compound C are each separately and alternatively pulsed into the processing chamber. Alternatively, a first precursor containing compound A and a second precursor containing compound B are each separately and alternatively pulsed into the processing chamber while, and a third precursor containing compound C is continuously flowed into the processing chamber. Alternatively, a pulse of a first precursor may overlap in time with a pulse of a second precursor while a pulse of a third precursor does not overlap in time with either pulse of the first and second precursors.

A "pulse"—as used herein—is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the processing chamber employed, the vacuum system coupled thereto, and the volatility/reactivity of the particular compound itself. A "half-reaction" as used herein to refer to a pulse of a precursor followed by a purge step.

Additional Disclosure

CVD tungsten has been used for more than 20 years as a primary conductor for high aspect ratio contacts, vias, trenches, and lines. Due to the growth kinetics of tungsten from $WF_6$—$H_2$ it has been possible to fill high aspect ratio features with almost 100% step coverage, but successful tungsten metallization utilizes or at least benefits a good barrier to protect the underlying dielectric from fluorine, a good adhesion layer that adheres to both the dielectric and tungsten, and finally a metallic tungsten nucleation layer to catalyze the $WF_6$—$H_2$ CVD reaction.

For high temperature conductor applications such as buried wordline or buried bitline in DRAM devices, the metal conductor must survive subsequent thermal processing typically greater than 1,000° C. while maintaining low resistivity in very narrow lines. In the 20 nm technology node these lines are expected to be less than 20 nm in width and projected to become even narrower in the future. In one examples, a barrier/adhesion/nucleation/fill metallization scheme based on titanium nitride, ALD tungsten nucleation and CVD tungsten would consume most of this feature with relatively high resistivity titanium nitride (greater than about 80 Ωμ-cm, such as greater than about 120 Ωμ-cm for thin films) and ALD tungsten nucleation (greater than about 100 Ωμ-cm for thickness within a range from about 20 Å to about 40 Å), a new approach is sought.

Embodiments of the invention provide a combination of ultra thin titanium nitride (thickness of about 20 Å or less, for example, about 10 Å or less) as an adhesion enhancement, MOCVD WN or W as a fluorine free barrier layer, and an intermediate RTP step to covert the MOCVD WN or W to largely pure metallic W. The resulting composite film is well anchored to dielectric substrates, highly dense, and relatively low in resistivity (less than about 100 Ωμ-cm at about 100 Å film thickness). Embodiments of the methods further provide an optimized ALD tungsten nucleation layer be deposited after the intermediate RTP in conjunction with CVD-W from $WF_6$—$H_2$. The ALD nucleation is an optional step intended to assure excellent nucleation and feature fill during CVD-W deposition and also to help template low resistivity CVD tungsten growth in the trench.

Embodiments for tungsten metallization provide: 1. an adhesion layer, 2. a diffusion barrier layer, 3. a tungsten nucleation layer, and 4. a bulk fill of W-CVD from $WF_6$—$H_2$.

In typical applications CVD or ALD titanium nitride is used as both an adhesion layer and a diffusion barrier. While a few monolayers (e.g., about 3 Å to about 10 Å) of titanium nitride can function effectively as an adhesion layer, it typically utilizes tens of angstroms (e.g., about 15 Å to about 40 Å) of titanium nitride to make an effective barrier against fluorine or boron diffusion. This creates a significant penalty for resistance in ultra-narrow features such as DRAM buried wordline or buried bitline applications with total feature critical dimensions of about 200 Å or less, such as about 100 Å or less.

While all the functional specifications for tungsten metallization are maintained, we propose to use novel materials and novel process integration sequences to reduce the overall resistance of thin tungsten features without compromising on adhesion, diffusion barrier performance, or tungsten nucleation and fill.

Some of the embodiments of the process sequence for tungsten metallization described herein include:

1. An adhesion layer of about 20 Å or less of titanium nitride and/or about 10 Å or less of titanium nitride. The titanium nitride must be thick enough to provide adequate adhesion to the dielectric but need not function as a diffusion barrier.

2. A tungsten nitride intermediate layer (e.g., $W_xN_yC_z$ barrier layer—tungsten nitride intermediate layer 230). This layer may be deposited or otherwise formed by a CVD process or an ALD process, such as by a metallic-organic CVD process or a metallic-organic ALD process. The final film is rich in W with either a $WN_x$ or $WC_x$ structure. Oxygen may also contain part of the film, but at a low oxygen content. Hydrocarbons and amines may also be present in the film in trace or even substantial quantities.

3. An intermediate rapid thermal processing step (RTP) in which a tungsten nitride intermediate layer is reduced to a predominantly a tungsten barrier layer containing metallic tungsten (e.g., W) or tungsten-carbon material (e.g., $WC_x$) film with the majority of other elements being outgassed. In the case of metallic-organic $WN_x$ the intermediate RTP is intended to reduce the as-deposited $WN_x$ to W by thermal decomposition. WN is generally unstable above 800° C. and reverts readily to tungsten. The intermediate RTP may be performed in a hydrogen-rich ambient to facilitate the formation of metallic W and also to help volatilize residual hydrocarbons or amines in the as-deposited tungsten nitride intermediate layer. The final form of the TiN/W(x)N(y)C(z) bi-layer after RTP is a smooth, dense, and conformal layer of metallic tungsten or tungsten-carbon material with a thin interfacial layer of titanium nitride to bond it to its underlying dielectric.

4. A tungsten nucleation and bulk fill process to fill the feature with low resistivity tungsten. Exemplary implementations of the tungsten metallization processes may be performed by direct $WF_6$—$H_2$ nucleation on the pre-formed metallic W from the intermediate RTP process. In cases where the tungsten layer formed by intermediate RTP of MO-$WN_x$ or MO-W or MO-$WC_x$ has an insufficiently metallic surface for effective W nucleation by $WF_6$—$H_2$, it may also be necessary to add a thin (thickness of about 25 Å or less, such as about 10 Å or less) layer of tungsten nucleation deposited by ALD or CVD. This ALD-W nucleation layer may be formed from a reducing agent (e.g., $WF_6$—$SiH_4$, $WF_6$—$Si_2H_6$, $WF_6$—$B_2H_6$), or any comparable reducing agents. The nucleation process may be enhanced by the presence of adsorbed $BH_x$ or $SiH_x$ layers produced by exposing the surface to a reducing agent, such as diborane, silane, disilane, derivatives thereof, combinations thereof, or other related compounds and may also be performed in the presence of hydrogen gas ($H_2$) as a minority or majority gas species.

One benefit provided by this scheme is the use of metallic-organic WN(x) or WC(x) CVD processes to form the tungsten nitride intermediate layer as a primary barrier on the titanium nitride adhesion layer. This barrier is then converted to low-resistivity metallic tungsten or tungsten-carbon material after intermediate RTP. The resulting metallic tungsten or tungsten-carbon material layer is also expected to possess density close to the bulk density of metallic tungsten or tungsten-carbon material. The resistivity of this barrier is far lower than the ultimate resistivity of titanium nitride (about 70 Ωμ-cm or greater, which typically utilizes greater than 100 Å to achieve).

In addition to low resistivity, the post-RTP metallic tungsten or tungsten-carbon material layer provides a metallic or near metallic W interface for subsequent W growth from $WF_6$—$H_2$. In cases where the surface quality is not fully optimized for $WF_6$—$H_2$ nucleation, an optional ALD-W nucleation layer from $WF_6$—$SiH_4$ or $WF_6$—$B_2H_6$ or similar reducing agents may be employed, but the layer thickness is significantly less than for ALD-W nucleation directly on titanium nitride since the surface after RTP is already very close to metallic tungsten.

Yet another benefit by utilizing the metallic-organic WN(x) or WC(x) CVD processes to form the tungsten nitride intermediate layer+intermediate RTP is that the resulting metallic tungsten or tungsten-carbon material layer is largely dense W, which is a highly effective barrier to fluorine diffusion. Fluorine diffusion is a primary failure mode for tungsten adhesion and gate dielectric damage. Metallic tungsten and or a tungsten-containing compound is generally a better and lower resistivity barrier material for fluorine diffusion than titanium nitride.

In some embodiments described herein, a tungsten pulsed PE-CVD process may be utilized to form a tungsten nitride intermediate layer (e.g., tungsten nitride intermediate layer 230). The tungsten pulsed PE-CVD process may include 1. a reducing agent dose (e.g., $SiH_4$, $B_2H_6$, or another reducing agent), 2. a gas purge step to remove reducing agent from the gas stream, 3. a low-energy RF plasma step to remove adsorbed reducing agent from the surface of the wafer and any areas shadowed by reentrant feature geometry, barrier defect crack's-crevices, or areas deep in a high aspect ratio feature, 4. a dose of $WF_6$ to react on the wafer surface with remaining adsorbed reducing agent from the preceding step, and 5. a gas purge to remove $WF_6$ and reaction products from the gas stream.

The low energy plasma step above should have ion energies below the sputter threshold of the barrier layer, tungsten, or any exposed substrate. It should also be high enough to remove adsorbed reducing agent species, for example, within a range from about 10 eV to about 20 eV ion energies—that may be appropriate for this purpose, but other ion energies may also be effective.

To avoid barrier attack by $WF_6$, it may be desirable to run one or more conventional ALD-W cycles prior to starting ALD-W with surface reducing agent removal. In this way the surface of the barrier may be protected from fluorine by a few monolayers of ALD tungsten.

ALD-W with surface reducing agent removal may be run one or more times as needed to deposit, grow, or otherwise form tungsten in re-entrant areas or deeply recessed areas of semiconductor devices. In general, one would continue running ALD with reducing agent surface removal until the feature profile was no longer re-entrant. Once the feature is no longer re-entrant, conformal CVD-W can be used to complete metal fill of the feature with no internal voids.

While the foregoing is directed to embodiments of the invention, other and further embodiments of the invention may be devised without departing from the basic scope thereof, and the scope thereof is determined by the claims that follow.

The invention claimed is:

1. A method for forming a tungsten-containing material on a substrate, comprising:
   forming an adhesion layer on a dielectric layer disposed on a substrate;
   forming a tungsten nitride intermediate layer on the adhesion layer, wherein the tungsten nitride intermediate layer comprises tungsten nitride and carbon;
   forming a tungsten barrier layer from the tungsten nitride intermediate layer during a thermal annealing process, wherein the tungsten barrier layer comprises metallic tungsten or tungsten-carbon material formed by thermal decomposition of the tungsten nitride intermediate layer;
   forming a nucleation layer on the tungsten barrier layer; and
   forming a tungsten bulk layer on the nucleation layer.

2. The method of claim 1, wherein the adhesion layer comprises a metal.

3. The method of claim 1, wherein the adhesion layer comprises a metal nitride.

4. A method for forming a tungsten-containing material on a substrate, comprising:
   forming an adhesion layer on a dielectric layer disposed on a substrate;
   forming a tungsten nitride intermediate layer on the adhesion layer, wherein the tungsten nitride intermediate layer comprises tungsten nitride and carbon;
   heating the tungsten nitride intermediate layer to a decomposition temperature during a thermal annealing process, wherein the tungsten nitride intermediate layer decomposes to form a tungsten barrier layer comprising metallic tungsten or tungsten-carbon material and the decomposition temperature is within a range from about 700° C. to less than 1,000° C.;
   forming a nucleation layer on the tungsten barrier layer; and
   forming a tungsten bulk layer on the nucleation layer.

5. The method of claim 4, wherein the adhesion layer comprises a metal.

6. The method of claim 4, wherein the adhesion layer comprises a metal nitride.

7. The method of claim 4, wherein the adhesion layer has a thickness within a range from about 5 Å to about 25 Å.

8. The method of claim 4, wherein the adhesion layer is deposited by atomic layer deposition or physical vapor deposition.

9. The method of claim 4, wherein the tungsten nitride intermediate layer has a thickness within a range from about 5 Å to about 150 Å.

10. The method of claim 4, wherein the tungsten nitride intermediate layer is deposited by atomic layer deposition, chemical vapor deposition, or physical vapor deposition.

11. The method of claim 4, wherein the tungsten nitride intermediate layer has a tungsten concentration within a range from about 40 at % to about 60 at %, a nitrogen concentration within a range from about 20 at % to about 40 at %, and a carbon concentration within a range from about 5 at % to about 15 at %.

12. The method of claim 4, wherein the tungsten nitride intermediate layer has a tungsten concentration within a range from about 40 at % to about 60 at %, a nitrogen concentration within a range from about 5 at % to about 20 at %, and a carbon concentration within a range from about 20 at % to about 40 at %.

13. The method of claim 12, wherein the tungsten barrier layer has a tungsten concentration within a range from about 70 at % to about 99 at %, a nitrogen concentration within a range from about 1 ppb to about 10 at %, and a carbon concentration within a range from about 1 at % to about 15 at %.

14. The method of claim 13, wherein the tungsten barrier layer has an electrical resistivity of less than 200 Ωμ-cm.

15. The method of claim 12, wherein the tungsten nitride intermediate layer further comprises oxygen and has an oxygen concentration within a range from about 1 at % to about 10 at %.

16. The method of claim 15, wherein the tungsten barrier layer further comprises oxygen and has an oxygen concentration within a range from about 1 ppb to about 1 at %.

17. A method for forming a tungsten-containing material on a substrate, comprising:
   forming an adhesion layer on a dielectric layer disposed on a substrate;
   forming a tungsten nitride intermediate layer on the adhesion layer, wherein the tungsten nitride intermediate layer comprises tungsten nitride and carbon;
   forming a tungsten barrier layer from the tungsten nitride intermediate layer during a thermal annealing process, wherein the tungsten barrier layer comprises metallic tungsten or tungsten-carbon material formed by thermal decomposition of the tungsten nitride intermediate layer; and forming a tungsten bulk layer directly on the tungsten barrier layer.

18. The method of claim 17, wherein the adhesion layer comprises a metal.

19. The method of claim 17, wherein the adhesion layer comprises a metal nitride.

* * * * *